(12) United States Patent
Tanibuchi et al.

(10) Patent No.: US 9,970,104 B2
(45) Date of Patent: May 15, 2018

(54) COATED TOOL

(71) Applicant: KYOCERA Corporation, Kyoto-shi, Kyoto (JP)

(72) Inventors: Takahito Tanibuchi, Satsumasenndai (JP); Yoshikazu Kodama, Satsumasenndai (JP)

(73) Assignee: KYOCERA CORPORATION, Kyoto (JP)

( * ) Notice: Subject to any disclaimer, the term of this patent is extended or adjusted under 35 U.S.C. 154(b) by 72 days.

(21) Appl. No.: 14/914,123

(22) PCT Filed: Aug. 27, 2014

(86) PCT No.: PCT/JP2014/072476
§ 371 (c)(1),
(2) Date: Feb. 24, 2016

(87) PCT Pub. No.: WO2015/030073
PCT Pub. Date: Mar. 5, 2015

(65) Prior Publication Data
US 2016/0201192 A1 Jul. 14, 2016

(30) Foreign Application Priority Data
Aug. 27, 2013 (JP) .................... 2013-175758

(51) Int. Cl.
*C23C 16/04* (2006.01)
*C23C 16/40* (2006.01)
(Continued)

(52) U.S. Cl.
CPC ......... *C23C 16/403* (2013.01); *C23C 16/347* (2013.01); *C23C 28/042* (2013.01); *C23C 28/044* (2013.01)

(58) Field of Classification Search
USPC .......... 51/307, 309; 428/216, 698, 701, 702; 427/255
See application file for complete search history.

(56) References Cited

U.S. PATENT DOCUMENTS 6,337,152 B1 * 1/2002 Kukino ................. C04B 41/009
51/307
7,455,900 B2 * 11/2008 Ruppi .................. C04B 41/009
428/698
7,695,764 B2 4/2010 Ruppi

FOREIGN PATENT DOCUMENTS

JP 06-316758 A 11/1994
JP 10-204639 A 8/1998
(Continued)

OTHER PUBLICATIONS

International Search Report (Form PCT/ISA/210) dated Dec. 2, 2014, issued for International Patent Application No. PCT/JP2014/072476.
(Continued)

Primary Examiner — Archene Turner
(74) Attorney, Agent, or Firm — Volpe and Koenig, P.C.

(57) ABSTRACT

Provided is a coated tool exhibiting enhanced wear resistance and adhesiveness of an aluminum oxide layer and superior wear resistance and defect resistance. A cutting tool (1) in which at least a titanium carbonitride layer (8) and an aluminum oxide layer (10) having an α-type crystalline structure are laminated in that order on a surface of a substrate (5). A surface-side Tc(116) in a surface-side peak is greater than a substrate-side Tc(116) in a substrate-side peak where Tc(116) is an orientation factor of the aluminum oxide layer (10) when comparing the substrate-side peak detected by measuring a portion on a substrate (5) side of the aluminum oxide layer (10) and the surface-side peak detected by measuring a portion on a surface side of the
(Continued)

aluminum oxide layer (10) in X-ray diffraction analysis of the aluminum oxide layer (10).

20 Claims, 2 Drawing Sheets

(51) Int. Cl.
*C23C 16/34* (2006.01)
*C23C 28/04* (2006.01)

(56) References Cited

FOREIGN PATENT DOCUMENTS

| | | |
|---|---|---|
| JP | 2000-144427 A | 5/2000 |
| JP | 2003-025114 A | 1/2003 |
| JP | 2009-202264 A | 9/2009 |
| JP | 2011-068960 A | 4/2011 |
| JP | 2012-076155 A | 4/2012 |
| JP | 2013-132717 A | 7/2013 |

OTHER PUBLICATIONS

Office Action dated Nov. 17, 2015 and issued by Japanese Patent Office for Japanese Patent Application No. 2015-515743.
PCT Third Party Observation for International Application No. PCT/JP2014/072476, submitted by an anonymous third party on Dec. 24, 2015.

\* cited by examiner

COATED TOOL

TECHNICAL FIELD

The present invention relates to a coated tool which includes a coating layer on the surface of a substrate.

BACKGROUND ART

Coated tools known to-date include cutting tools in which a single or a plurality of titanium carbide layers, titanium nitride layers, titanium carbonitride layers, aluminum oxide layers, and titanium aluminum nitride layers are formed on the surface of a substrate such as cemented carbide alloy, cermet, or ceramic.

In such cutting tools, opportunities for using heavy interrupted machining or the like, in which high impact is applied to the cutting edge, have increased with the recent increased performance of cut processing, and improvements in defect resistance and wear resistance have come to be demanded in order to suppress peeling of the coating layer or chipping due to the high impact applied to the coating layer.

As technology that improves defect resistance in the above cutting tools, Patent Document 1 discloses technology by which a compact aluminum oxide layer having high defect resistance can be formed by appropriately adjusting the particle size and layer thickness of the aluminum oxide layer and by setting the texture coefficient (orientation factor) in the (012) face to not less than 1.3. Patent Document 2 discloses technology by which defect resistance of an aluminum oxide layer can be improved by enabling easy release of residual stress in the aluminum oxide layer by setting the texture coefficient in the (012) face of the aluminum oxide layer to not less than 2.5.

As technology that improves wear resistance in the above cutting tool, Patent Document 3 discloses technology by which strength and toughness of a coating film can be improved by forming an aluminum oxide layer positioned directly above an intermediate layer so as to result in lamination of unit layers of two or more layers exhibiting different X-ray diffraction patterns.

Patent Document 4 discloses a cutting tool in which the orientation factor of the (006) face of an aluminum oxide layer is not less than a high 1.8, and the peak intensity ratio I(104)/I(110) of the (104) face to the (110) face is controlled within a prescribed range. Additionally, Patent Document 5 discloses a cutting tool in which the peak intensity ratio I(104)/I(012) of the (104) face to the (012) face is greater in a second face than in a first face on the bottom side of an aluminum oxide layer.

CITATION LIST

Patent Literature

Patent Literature 1: Japanese Unexamined Patent Application Publication No. H06-316758A
Patent Literature 2: Japanese Unexamined Patent Application Publication No. 2003-025114A
Patent Literature 3: Japanese Unexamined Patent Application Publication No. H10-204639A
Patent Literature 4: Japanese Unexamined Patent Application Publication No. 2013-132717A
Patent Literature 5: Japanese Unexamined Patent Application Publication No. 2009-202264A

SUMMARY OF INVENTION

Technical Problem

In the coated tools described in the above Patent Documents 1 to 5, the wear resistance and defect resistance of the coating layer are insufficient. In particular, microscopic chipping occurs in the aluminum oxide layer, and with this as a trigger, wear progresses. Furthermore, the adhesion force of the aluminum oxide layer is weak and it often peels. Therefore, further improvement of the aluminum oxide layer is demanded.

Thus, an object of the present invention is to provide a coated tool exhibiting enhanced wear resistance and adhesiveness of an aluminum oxide layer and superior wear resistance and defect resistance.

Solution to Problem

In the coated tool of the present invention, at least a titanium carbonitride layer and an aluminum oxide layer having an α-type crystalline structure are laminated in that order on a substrate surface. A surface-side Tc(116) in a surface-side peak is greater than a substrate-side Tc(116) in a substrate-side peak where Tc(116) is an orientation factor expressed by the following general formula Tc(hkl) of the aluminum oxide layer when comparing the substrate-side peak detected by measuring a portion on a substrate side of the aluminum oxide layer and the surface-side peak detected by measuring a portion on a surface side of the aluminum oxide layer in X-ray diffraction analysis of the aluminum oxide layer, orientation factor $Tc(hkl)=\{I(hkl)/I_0(hkl)\}/[(1/7)\times\Sigma\{I(HKL)/I_0(HKL)\}]$ where (HKL) represents seven faces of (012), (104), (110), (113), (024), (116), and (124);
(hkl) represents any of (012), (104), (110), (113), (024), (116), and (124);
each of I(HKL) and I(hkl) represents a peak intensity of a peak attributed to respective crystal faces detected in X-ray diffraction analysis of the aluminum oxide layer; and
each of $I_0$(HKL) and $I_0$(hkl) represents a standard diffraction intensity of respective crystal faces described in JCPDS card no. 46-1212.

Advantageous Effects of Invention

According to the present invention, resistance to breakage of aluminum oxide crystals can be improved and progression of wear caused by microscopic chipping can be suppressed on the surface side of the aluminum oxide layer, while on the substrate side of the aluminum oxide layer, adhesiveness with the layer provided nearer the substrate side from the aluminum oxide layer can be improved and peeling of the aluminum oxide layer can be suppressed. As a result, wear resistance and adhesiveness of the aluminum oxide layer improve.

DESCRIPTION OF EMBODIMENTS

Figure 1:
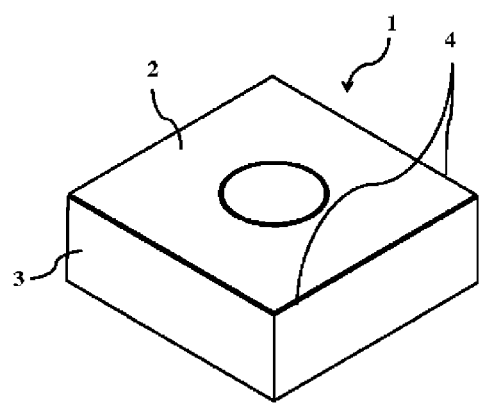
FIG. 1 is a schematic perspective view of an example of a cutting tool pertaining to the present invention.

In a cutting tool (abbreviated simply as "tool" hereinafter) 1 which illustrates an embodiment of the coated tool of the present invention, as illustrated in FIG. 1, one of the main faces of the tool 1 serves as a rake face 2, and a side face serves as a relief face 3, and the crossing ridge portion formed by the rake face 2 and the relief face 3 serves as a cutting edge 4.

Figure 2:
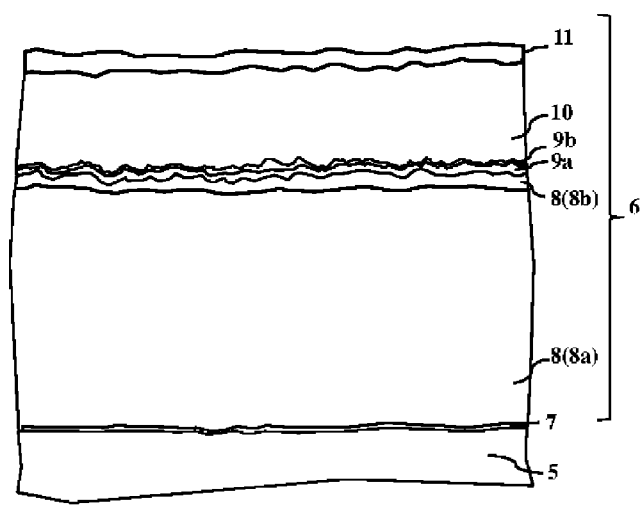
FIG. 2 is a schematic section view of the cutting tool of FIG. 1.

Furthermore, as illustrated in FIG. 2, the tool 1 includes a substrate 5 and a coating layer 6 provided on the surface of this substrate 5. The coating layer 6 is made from a bottom layer 7 made from TiN, a titanium carbonitride layer 8, an intermediate layer 9, an aluminum oxide layer 10, and a surface layer 11 made from TiN, laminated in that order from the substrate 5 side. The aluminum oxide layer 10 is made from an α-type crystalline structure.

In the present embodiment, when a substrate-side peak detected by measuring a portion on a substrate 5 side of the aluminum oxide layer 10 and a surface-side peak detected by measuring a portion on a surface side of the aluminum oxide layer 10 in X-ray diffraction analysis of the aluminum oxide layer 10 are compared, among orientation factors Tc(116) expressed by the following general formula Tc(hkl) of the aluminum oxide layer 10, the surface-side Tc(116) in the surface-side peak is greater than the substrate-side Tc(116) in the substrate-side peak, $$\text{orientation factor } Tc(hkl) = \{I(hkl)/I_0(hkl)\}/[(1/7) \times \Sigma\{I(HKL)/I_0(HKL)\}]$$

where (HKL) represents seven faces of (012), (104), (110), (113), (024), (116), and (124);

(hkl) represents any of (012), (104), (110), (113), (024), (116), and (124);

each of I(HKL) and I(hkl) represents a peak intensity of a peak attributed to respective crystal faces detected in X-ray diffraction analysis of the aluminum oxide layer; and each of $I_0$(HKL) and $I_0$(hkl) represents a standard diffraction intensity of respective crystal faces described in JCPDS card no. 46-1212.

As a result, resistance to breakage of aluminum oxide crystals can be improved and progression of wear caused by microscopic chipping can be suppressed on the surface side of the aluminum oxide layer 10, while on the substrate 5 side of the aluminum oxide layer 10, adhesiveness with the titanium carbonitride layer 8 or intermediate layer 9 can be improved and peeling of the aluminum oxide layer 10 can be suppressed. As a result, wear resistance and adhesiveness of the aluminum oxide layer 10 improve.

Here, when the orientation factor Tc(116) is high, i.e., when the ratio of I(116), I(116) being peak intensity of the (116) plane, is high, the aluminum oxide crystals that constitute the aluminum oxide layer 10 readily warp in response to impact applied in the film deposition direction (direction perpendicular to the surface) from the surface side of the aluminum oxide layer 10, and resistance to breakage is high. Here, due to the fact that the orientation factor Tc(116) is high on the surface side of the aluminum oxide layer 10, microscopic chipping that occurs on the surface of the aluminum oxide layer 10 can be suppressed and progression of wear caused by microscopic chipping can be suppressed. The desirable range of surface-side Tc(116) is from 0.7 to 2.0.

On the other hand, when the orientation factor Tc(116) is high, the coefficient of thermal expansion in the direction parallel to the surface of the aluminum oxide layer 10 is high, and there ends up being a large difference between it and the coefficient of thermal expansion of the intermediate layer 9 or titanium carbonitride layer 8 nearer the substrate 5 side from the aluminum oxide layer 10. Thus, by setting the orientation factor Tc(116) of the substrate side of the aluminum oxide layer 10 to a small value, peeling of the aluminum oxide layer 10 can be suppressed. The desirable range of substrate-side Tc(116) is from 0.3 to 0.7. Furthermore, the titanium carbonitride layer 8 is provided at a thickness from 6.0 to 13.0 μm, and the intermediate layer 9 is provided at a thickness from 0.05 to 0.5 μm.

The method for measuring the substrate-side Tc(116) and the surface-side Tc(116) of the aluminum oxide layer 10 will be described. X-ray diffraction analysis of the aluminum oxide layer 10 is performed using a general X-ray diffraction analysis apparatus that uses a CuKα beam. In determining the peak intensities of each of the crystal faces of the aluminum oxide layer 10 from an X-ray diffraction chart, the diffraction angle of each of the crystal faces listed on JCPDS card no. 46-1212 is checked, the crystal faces of the detected peaks are identified, and their peak intensities are measured.

In measuring surface-side Tc(116), the peak intensity of the surface-side portion of the aluminum oxide layer 10 is measured. Specifically, X-ray diffraction analysis is performed on the coating layer 6 in a state where the surface layer 11 has been removed by grinding or a state in which the surface layer 11 has not been ground. The peak intensity of each of the obtained peaks is measured, and the orientation factor Tc(hkl) is calculated. Furthermore, when removing the surface layer 11 by grinding, a thickness not greater than 20% of the thickness of the aluminum oxide layer 10 may be removed. X-ray diffraction analysis may be performed in the state where the surface layer 11 has not been ground as long as the seven peaks of aluminum oxide can be measured.

In measuring substrate-side Tc(116), the peak intensity of the substrate-side portion of the aluminum oxide layer 10 is measured. Specifically, first, the aluminum oxide layer 10 of the coating layer 6 is ground to a prescribed thickness. Grinding is performed by brush processing using diamond abrasive grains, processing with an elastic grindstone, blasting, or the like. Grinding is performed until the thickness of the aluminum oxide layer 10 is from 10 to 40% of the thickness of the aluminum oxide layer 10 before grinding. After that, X-ray diffraction analysis is performed on the ground portion of the aluminum oxide layer 10 under the same conditions as measurement on the surface-side portion of the aluminum oxide layer 10, and the peaks of the aluminum oxide layer 10 are measured, and the orientation factors Tc(hkl) are calculated.

The surface-side Tc(116) in the surface-side peaks of the aluminum oxide layer 10 measured by this method may be compared with the substrate-side Tc(116). Note that the orientation factor Tc is determined as a ratio relative to unoriented standard data set forth on a JCPDS card, and therefore expresses the degree of orientation of each of the crystal planes.

According to the present embodiment, I(104) and I(106) are the first and second most intense of the surface-side peaks of the aluminum oxide layer 10. That is, I(104) may be the first most intense and I(116) the second most intense, or I(116) may be the first most intense and I(104) the second most intense. As a result, crater wear of the rake face 2 side is suppressed. Additionally, flank wear caused by microscopic chipping tends to be suppressed on the relief face 3 side.

In the present embodiment, the ratio ((116)/(104)) of I(116) in the surface-side peak to I(104) in the surface-side peak is from 0.5 to 1.7. As a result, chipping resistance on the surface side of the aluminum oxide layer 10 can be increased.

Additionally, according to the present embodiment, the surface-side Tc(104) in the surface-side peak is greater than the substrate-side Tc(104) in the substrate-side peak. As a result, flank wear on the relief face 3 can be suppressed, and there is also the effect that defect resistance on the rake face 2 is increased, thereby increasing the defect resistance of the cutting tool 1.

In this case, if the surface-side Tc(116) is greater than the substrate-side Tc(116), the crater wear resistance of the aluminum oxide layer 10 improves greatly.

The titanium carbonitride layer 8 is made from a configuration in which a so-called MT-titanium carbonitride layer 8a, made from pillar-shaped crystals deposited at a relatively low deposition temperature of 780 to 900° C. and containing acetonitrile ($CH_3CN$) gas as a raw material, and a so-called HT titanium carbonitride layer 8b, made from granular crystals deposited at a relatively high deposition temperature of 950 to 1100° C., are deposited in that order from the substrate side. According to the present embodiment, protrusions having a triangular cross-section narrowing toward the aluminum oxide layer 10 are formed on the HT-titanium carbonitride layer 8b, and as a result, the adhesion force with the aluminum oxide layer 10 increases, and peeling and chipping of the coating layer 6 can be suppressed.

Furthermore, according to the present invention, the intermediate layer 9 is provided on the surface of the HT-titanium carbonitride layer 8b. The intermediate layer 9 contains titanium together with oxygen, and is made from, for example, TiAlCNO, TiCNO, or the like. As a result, the aluminum oxide grains that constitute the aluminum oxide layer 10 have an α-type crystalline structure. The aluminum oxide layer 10 made from an α-type crystalline structure has high hardness and can increase the wear resistance of the coating layer 6. Furthermore, in FIG. 2, the intermediate layer 9 is formed by laminating a lower intermediate layer 9a and an upper intermediate layer 9b. Due to the fact that the intermediate layer 9 is made from a laminate structure of a lower intermediate layer 9a made from TiAlCNO and an upper intermediate layer 9b made from TiCNO, there is the effect of increasing the defect resistance of the cutting tool 1.

Additionally, the bottom layer 7 and the surface layer 11 are made from titanium nitride. In other embodiments of the present invention, the bottom layer 7 and surface layer 11 may be materials other than titanium nitride, such as titanium carbonitride, titanium oxycarbonitride, and chromium nitride. At least one of the bottom layer 7 and the surface layer 11 may be omitted. The bottom layer 7 is provided at a thickness of from 0.0 to 1.0 μm, and the surface layer 11 is provided at a thickness of from 0.0 to 3.0 μm.

The thickness of each layer and the properties of the crystals that constitute each layer may be measured by observing an electron microscope photograph (scanning electron microscope (SEM) photograph or transmission electron microscope (TEM) photograph) of a cross-section of the tool 1. In the present invention, the crystal form of the crystals that constitute each layer of the coating layer 6 being pillar-shaped indicates a state in which the ratio of the average crystal width relative to the length of each crystal in the direction of thickness of the coating layer 6 is not greater than 0.3 on average. On the other hand, when the ratio of the average crystal width relative to the length of each crystal in the direction of thickness of the coating layer is greater than 0.3, it is defined as a granular crystal form.

On the other hand, the substrate 5 of the tool 1 may be a Ti-based cermet or a cemented carbide alloy in which a hard phase made from tungsten carbide (WC) and, as desired, at least one type selected from the group consisting of carbides, nitrides, and carbonitrides of a metal of group 4, 5, or 6 of the periodic table is bonded with a bonding phase made from an iron group metal such as cobalt (Co) or nickel (Ni), or it may be a ceramic such as $Si_3N_4$, $Al_2O_3$, diamond, or cubic boron nitride (cBN). Above all, when the tool 1 is employed as a cutting tool, the substrate 5 being made from a cemented carbide alloy or a cermet is advantageous from the perspectives of defect resistance and wear resistance. Depending on the application, the substrate 5 may be made from a metal such as carbon steel, high-speed steel, or alloy steel.

The above cutting tool 1 performs cut processing by means of the cutting edge formed at the intersection of the rake face and the relief face impinging on the work material, and can exhibit the superior effects described above. The coated tool of the present invention may also be used in various applications other than the cutting tool 1, such as wear parts including sliding parts and dies, excavation tools, tools such as cutlery, and abrasion-resistant parts. It has superior mechanical reliability in these cases as well.

Next, the manufacturing method of the coated tool pertaining to the present invention will be described in reference to an example of a manufacturing method of the tool 1.

(Production of Substrate)

First, metal powder, carbon powder, and the like are added as appropriate to inorganic powder such as a metal carbide, nitride, carbonitride, or oxide that can be formed by firing a hard alloy serving as the substrate 5. These are mixed, and then molded into a prescribed tool shape by a known molding method such as press molding, cast molding, extrusion molding, or cold isostatic pressing, and then fired in vacuum or in a non-oxidizing atmosphere, thereby producing a substrate 5 made from the hard alloy described above. Then, grinding processing or honing processing of the cutting edge portion is performed as desired on the surface of the substrate 5.

Then, a coating layer is deposited on the surface thereof by chemical vapor deposition (CVD).

First, as the reaction gas composition, a mixed gas made from 0.5 to 10 volume % of titanium tetrachloride ($TiCl_4$) gas, 10 to 60 volume % of nitrogen ($N_2$) gas, and the remainder hydrogen ($H_2$) gas is prepared and introduced into a chamber, and a TiN layer which is the bottom layer 7 is deposited at a deposition temperature of 800 to 940° C. at 8 to 50 kPa.

Then, as the reaction gas composition, a mixed gas made from 0.5 to 10 volume % of titanium tetrachloride ($TiCl_4$) gas, 10 to 60 volume % of nitrogen ($N_2$) gas, 0.1 to 3.0 volume % of acetonitrile gas ($CH_3CN$) gas, and the remainder hydrogen ($H_2$) gas is prepared and introduced into the chamber, and an MT-titanium carbonitride layer is deposited at a deposition temperature of 780 to 880° C. at 5 to 25 kPa.

Then, an HT-titanium carbonitride layer that constitutes the upper portion of the titanium carbonitride layer 8 is deposited. By deposition of the above MT-titanium carbonitride layer and this HT-titanium carbonitride layer, protrusions are formed on the surface of the titanium carbonitride layer 8. According to the present embodiment, the specific deposition conditions of the HT-titanium carbonitride layer are that a mixed gas made from 1.0 to 4 volume % of titanium tetrachloride ($TiCl_4$) gas, 0.1 to 10 volume % of methane ($CH_4$) gas, 5 to 20 volume % of nitrogen ($N_2$) gas, and the remainder hydrogen ($H_2$) gas is prepared and introduced into the chamber, and the layer is deposited at a deposition temperature of 900 to 1050° C. at 5 to 40 kPa.

Additionally, an intermediate layer 9 is produced. The specific deposition conditions of the present embodiment are that, as a first stage, a mixed gas made from 3 to 10 volume % of titanium tetrachloride ($TiCl_4$) gas, 3 to 10 volume % of methane ($CH_4$) gas, 5 to 20 volume % of nitrogen ($N_2$) gas, 0.5 to 2 volume % of carbon monoxide (CO) gas, 0.5 to 3 volume % of aluminum trichloride ($AlCl_3$) gas, and the remainder hydrogen ($H_2$) gas is prepared. This mixed gas is prepared and introduced into the chamber, and a layer is deposited at a deposition temperature of 900 to 1050° C. at 5 to 40 kPa.

Then, as a second stage of the intermediate layer 9, a mixed gas made from 1 to 3 volume % of titanium tetrachloride ($TiCl_4$) gas, 1 to 3 volume % of methane ($CH_4$) gas, 5 to 20 volume % of nitrogen ($N_2$) gas, 2 to 5 volume % of carbon monoxide (CO) gas, and the remainder hydrogen ($H_2$) gas is prepared. This mixed gas is prepared and introduced into the chamber, and a layer is deposited at a deposition temperature of 900 to 1050° C. at 5 to 40 kPa. In this step, the nitrogen ($N_2$) gas may be changed to argon (Ar) gas.

Following that, an α-aluminum oxide layer 10 is deposited. As the deposition method of the α-aluminum oxide layer 10, first, using a mixed gas made from 0.5 to 5 volume % of aluminum trichloride ($AlCl_3$) gas, 0.5 to 3.5 volume % of hydrogen chloride (HCl) gas, and the remainder hydrogen ($H_2$) gas, a layer is deposited at a deposition temperature of 950 to 1100° C. at 5 to 10 kPa. Nuclei of aluminum oxide formed as the α-aluminum oxide layer 10 are produced by the deposition of the first stage, but the substrate-side Tc(116) is controlled by controlling the state of production of nuclei.

Then, using a mixed gas made from 0.5 to 10.0 volume % of aluminum trichloride ($AlCl_3$) gas, 0.5 to 5.0 volume % of hydrogen chloride (HCl) gas, 0.5 to 5.0 volume % of carbon dioxide ($CO_2$) gas, 0.0 to 0.5 volume % of hydrogen sulfide ($H_2S$) gas, and the remainder hydrogen ($H_2$) gas, an aluminum oxide layer 10 is deposited at a deposition temperature of 950 to 1100° C. at 5 to 10 kPa. At this time, as the deposition time of the aluminum oxide layer 10 elapses, the flow rate of $CO_2$ gas is constant and the flow rates of $AlCl_3$ gas and $H_2S$ gas are increased continuously or in a step-wise manner. As a result, the ratio of the reaction paths is changed, the growth state of the aluminum oxide crystals is changed, and the surface-side Tc(116) is increased.

Then, a surface layer (TiN layer) 11 is deposited as desired. As for the specific reaction conditions, as the reaction gas composition, a mixed gas made from 0.1 to 10 volume % of titanium tetrachloride ($TiCl_4$) gas, 10 to 60 volume % of nitrogen ($N_2$) gas, and the remainder hydrogen ($H_2$) gas is prepared and introduced into the chamber, and a layer is deposited at a deposition temperature of 960 to 1100° C. at 10 to 85 kPa.

After that, at least the cutting edge portion of the surface of the coating layer 6 that was deposited undergoes grinding processing. By this grinding processing, the cutting edge portion is processed smoothly, resulting in a tool which suppresses welding of work material and has superior defect resistance.

EXAMPLES

First, 6 mass % of metal cobalt powder of average particle size 1.2 μm, 0.5 mass % of titanium carbide powder of average particle size 2.0 μm, and 5 mass % of niobium carbide powder were added to tungsten carbide powder of average particle size 1.5 μm, they are mixed, and then molded into a tool shape (CNMG120408) by press molding. Then, binder removal treatment was performed, and by firing for 1 hour at 1500° C. under vacuum of 0.01 Pa, a substrate made from cemented carbide alloy was produced. After that, the produced substrate underwent brush processing, and R honing was performed on the portion serving as the cutting edge.

Then, a coating layer was deposited on the above cemented carbide alloy substrate by chemical vapor deposition (CVD) under the deposition conditions shown in Table 1, to produce a tool. In Tables 1 and 2, each of the compounds is expressed as its chemical symbol.

For sample nos. 1 to 5, when the aluminum oxide layer was deposited, first, deposition of the first stage was performed under the conditions of 1000° C. and 7 kPa using a mixed gas made from 3.0 volume % of aluminum trichloride ($AlCl_3$) gas, 1.5 volume % of hydrogen chloride (HCl) gas, and the remainder hydrogen ($H_2$) gas, and nuclei of the aluminum oxide layer were formed. For sample no. 8, when the aluminum oxide layer was deposited, first, deposition of the first stage was performed under the conditions of 1150° C. and 0.2 kPa using a mixed gas made from 22.0 volume % of aluminum trichloride ($AlCl_3$) gas, 37 volume % of carbon dioxide ($CO_2$) gas, and the remainder hydrogen ($H_2$) gas, and nuclei of the aluminum oxide layer were formed.

For the above sample nos. 1 to 8, X-ray diffraction analysis was performed on the flat face of the relief face using a CuKα beam in a state where only the surface TiN layer of the coating layer had been ground. The surface-side peaks in the surface-side portion of the aluminum oxide layer (denoted as "Surface-side" in the tables) were identified at three random locations, and the peak intensity of each peak was measured. At this time, it was ascertained that not less than 80% of the aluminum oxide layer thickness had been maintained. Then, it was ground until reaching 10 to 40% of the thickness of the aluminum oxide layer, and similarly, using X-ray diffraction analysis, the substrate-side peaks in the substrate-side portion of the aluminum oxide layer (denoted as "Substrate side" in the tables) were identified, and the peak intensity of each peak was measured. Using the obtained peak intensities of the peaks, the orientation factors Tc of the crystal faces of the (116) face, the (104) face, the (110) face, and the (012) face were calculated. Furthermore, a cross-section of the tool was observed by scanning electron microscope (SEM), and the thickness of each layer was measured. Results are shown in Tables 2 and 3.

Then, a continuous cutting test and an intermittent cutting test were performed for each sample under the following conditions, and wear resistance and defect resistance were evaluated. Results are shown in Table 4.

(Continuous Cutting Conditions)
  Work material: Chromium molybdenum steel (SCM435)
  Tool shape: CNMG120408
  Cutting speed: 300 m/min
  Feed rate: 0.3 mm/rev
  Depth of cut: 1.5 mm
  Cutting time: 25 min
  Other: Water-soluble cutting fluid was used
  Evaluated items: The honed portion of the blade tip was observed by scanning electron microscope, and in the portions that had actually worn, the amount of flank wear in the direction perpendicular to the rake face and crater wear on the rake face were measured.

(Intermittent Cutting Conditions)

Work material: Chromium molybdenum steel with four grooves inserted (SCM440)
Tool shape: CNMG120408
Cutting speed: 300 m/min
Feed rate: 0.3 mm/rev
Depth of cut: 1.5 mm
Other: Water-soluble cutting fluid was used
Evaluated item: Number of times impacted until defect

TABLE 1

| Coating layer | Mixed gas composition (volume %) | Furnace internal temperature (° C.) | Pressure (kPa) |
|---|---|---|---|
| TiN-1 | $TiCl_4$: 2.5, $N_2$: 23, $H_2$: remainder | 900 | 16 |
| TiCN-1(MT) | $TiCl_4$: 1.0, $N_2$: 10, $CH_3CN$: 0.1, $H_2$: remainder | 850 | 9 |
| TiCN-2(HT) | $TiCl_4$: 1.0, $N_2$: 10, $CH_4$: 2.0, $H_2$: remainder | 1010 | 9 |
| TiAlCNO-1 | $TiCl_4$: 3.0, $CH_4$: 4.5, $N_2$: 5.0, CO: 0.5, $AlCl_3$: 1.5, $H_2$: remainder | 1000 | 15 |
| TiCNO-1 | $TiCl_4$: 3.0, $CH_4$: 2.5, $N_2$: 5.0, CO: 3.0, $H_2$: remainder | 1000 | 15 |
| TiCNO-2 | $TiCl_4$: 3.0, $CH_4$: 2.5, $N_2$: 5.0, CO: 1.0, $H_2$: remainder | 1000 | 15 |
| $Al_2O_3$-1 | $AlCl_3$: 2.0, HCl: 2.0, $CO_2$: 1.0, $H_2$: remainder | 1000 | 10 |
| $Al_2O_3$-2 | $AlCl_3$: 4.0, HCl: 2.0, $CO_2$: 1.0, $H_2S$: 0.05, $H_2$: remainder | 1000 | 10 |
| $Al_2O_3$-3 | $AlCl_3$: 2.5→5.0, HCl: 2.0, $CO_2$: 1.3, $H_2S$: 0.02→0.1, $H_2$: remainder | 1000 | 10 |
| $Al_2O_3$-4 | $AlCl_3$: 4.0, HCl: 2.0, $CO_2$: 1.3, $H_2$: remainder | 1000 | 10 |
| $Al_2O_3$-5 | $AlCl_3$: 6.0, HCl: 2.0, $CO_2$: 1.3, $H_2S$: 0.4, $H_2$: remainder | 1000 | 10 |
| $Al_2O_3$-6 | $AlCl_3$: 4.3, HCl: 2.0, $CO_2$: 3.0, $H_2$: remainder | 970 | 20 |
| $Al_2O_3$-7 | $AlCl_3$: 8.0, HCl: 2.0, $CO_2$: 3.0, $H_2S$: 0.7, $H_2$: remainder | 1050 | 10 |
| $Al_2O_3$-8 | $AlCl_3$: 7.0→12, HCl: 2.0, $CO_2$: 3.5→6.0, $H_2S$: 0.3→2.0, $H_2$: remainder | 990 | 10 |
| $Al_2O_3$-9 | $AlCl_3$: 1.5, HCl: 5.0, $CO_2$: 1.0, $H_2$: remainder | 1005 | 6 |
| $Al_2O_3$-10 | $AlCl_3$: 2.0, HCl: 3.0, $CO_2$: 8.0, $H_2S$: 1.0, $H_2$: remainder | 1000 | 7 |
| TiN-2 | $TiCl_4$: 2.0, $N_2$: 44, $H_2$: remainder | 1010 | 80 |

*$Al_2O_3$-3, $Al_2O_3$-8:

Added amounts of each gas in the mixed gas ($AlCl_3$, $CO_2$, $H_2S$) were continuously varied from x to y.

TABLE 2

| | | Coating layer[Note 1] | | | | | | |
|---|---|---|---|---|---|---|---|---|
| Sample no. | Bottom layer | TiCN layer | | | Intermediate layer | | $Al_2O_3$ layer | | Surface layer |
| 1 | — | TiCN-1 (9) | TiCN-2 (0.2) | | TiAlCNO-1 (0.2) | TiCNO-1 (0.1) | $Al_2O_3$-1 (2) | $Al_2O_3$-2 (5) | TiN-2 (1.0) |
| 2 | TiN-1 (0.5) | TiCN-1 (9) | TiCN-2 (0.5) | | TiAlCNO-1 (0.1) | TiCNO-1 (0.1) | $Al_2O_3$-4 (1) | $Al_2O_3$-5 (6) | TiN-2 (2.0) |
| 3 | TiN-1 (0.5) | TiCN-1 (12) | TiCN-2 (0.1) | | TiAlCNO-1 (0.05) | TiCNO-1 (0.05) | $Al_2O_3$-3 (6) | | TiN-2 (1.5) |
| 4 | TiN-1 (1) | TiCN-1 (8) | TiCN-2 (0.3) | | TiAlCNO-1 (0.1) | TiCNO-1 (0.1) | α-$Al_2O_3$-6 (2) | $Al_2O_3$-7 (5) | — |
| 5 | TiN-1 (0.5) | TiCN-1 (6) | TiCN-2 (0.5) | | — | TiCNO-1 (0.5) | $Al_2O_3$-3 (8) | | TiN-2 (3) |
| 6 | TiN-1 (0.5) | TiCN-1 (9) | TiCN-2 (0.5) | | TiAlCNO-1 (0.1) | TiCNO-2 (0.2) | $Al_2O_3$-4 (1) | $Al_2O_3$-5 (6) | TiN-2 (2.0) |
| 7 | TiN-1 (1) | TiCN-1 (8) | TiCN-2 (0.3) | | TiAlCNO-1 (0.1) | TiCNO-2 (0.1) | α-$Al_2O_3$-6 (2) | $Al_2O_3$-7 (2) | TiN-2 (2.0) |
| 8 | TiN-1 (1) | TiCN-1 (6) | TiCN-2 (0.5) | | TiAlCNO-1 (0.1) | TiCNO-1 (0.1) | $Al_2O_3$-8 (6) | | TiN-2 (1) |
| 9 | TiN-1 (0.5) | TiCN-1 (9) | TiCN-2 (0.1) | | TiAlCNO-1 (0.1) | TiCNO-1 (0.1) | $Al_2O_3$-4 (1) | $Al_2O_3$-9 (6) | TiN-2 (0.5) |
| 10 | TiN-1 (0.5) | TiCN-1 (10) | TiCN-2 (0.3) | | TiAlCNO-1 (0.1) | TiCNO-1 (0.1) | $Al_2O_3$-10 (7) | | TiN-2 (2.0) |

[Note 1] Thickness of layer is shown in parentheses (units: μm).

TABLE 3

| | Orientation factor Tc of $Al_2O_3$ layer | | | | | | | | Surface-side XRD of $Al_2O_3$ layer | | |
|---|---|---|---|---|---|---|---|---|---|---|---|
| | Tc(116) | | Tc(104) | | Tc(110) | | Tc(012) | | First most | Second most | |
| Sample no. | Substrate side | Surface side | Substrate side | Surface side | Substrate side | Surface side | Substrate side | Surface side | intense peak | intense peak | I(116)/I(104) |
| 1 | 0.4 | 0.8 | 0.7 | 2.0 | 1.4 | 0.8 | 1.3 | 0.5 | (104) | (110) | 0.4 |
| 2 | 0.5 | 1.5 | 1.1 | 2.5 | 1.1 | 0.3 | 1.1 | 1.0 | (104) | (116) | 1.3 |

TABLE 3-continued

| | Orientation factor Tc of Al$_2$O$_3$ layer | | | | | | | | Surface-side XRD of Al$_2$O$_3$ layer | | |
| --- | --- | --- | --- | --- | --- | --- | --- | --- | --- | --- | --- |
| | Tc(116) | | Tc(104) | | Tc(110) | | Tc(012) | | First most | Second most | |
| Sample no. | Substrate side | Surface side | Substrate side | Surface side | Substrate side | Surface side | Substrate side | Surface side | intense peak | intense peak | I(116)/ I(104) |
| 3 | 0.3 | 1.0 | 0.5 | 2.3 | 1.5 | 0.7 | 1.7 | 0.7 | (104) | (116) | 0.9 |
| 4 | 0.7 | 2.0 | 1.7 | 3.0 | 1.0 | 0.4 | 1.0 | 0.3 | (104) | (116) | 1.1 |
| 5 | 0.5 | 0.7 | 0.8 | 1.7 | 1.2 | 1.0 | 1.5 | 0.5 | (104) | (116) | 0.8 |
| 6 | 0.7 | 1.9 | 0.6 | 1.1 | 0.9 | 0.4 | 1.1 | 0.2 | (116) | (104) | 1.5 |
| 7 | 0.4 | 1.2 | 0.9 | 1.5 | 1.1 | 0.5 | 1.4 | 0.3 | (104) | (116) | 0.8 |
| 8 | 0.4 | 0.4 | 0.6 | 2.5 | 1.2 | 0.6 | 1.0 | 1.3 | (104) | (012) | 0.3 |
| 9 | 0.6 | 0.6 | 0.7 | 2.1 | 1.4 | 0.7 | 1.2 | 1.4 | (104) | (110) | 0.2 |
| 10 | 0.7 | 0.7 | 0.8 | 2.0 | 11.1 | 0.8 | 1.1 | 1.2 | (012) | (104) | 0.4 |

TABLE 4

| | Cutting performance | | |
| --- | --- | --- | --- |
| Sample no. | Crater wear width Kb (mm) | Flank wear width Vb (mm) | Number of times impacted (times) |
| 1 | 0.28 | 0.20 | 2900 |
| 2 | 0.16 | 0.13 | 3400 |
| 3 | 0.20 | 0.15 | 3000 |
| 4 | 0.15 | 0.12 | 3500 |
| 5 | 0.25 | 0.17 | 2800 |
| 6 | 0.21 | 0.14 | 3700 |
| 7 | 0.28 | 0.19 | 3400 |
| 8 | 0.38 | 0.28 | 2500 |
| 9 | 0.45 | 0.30 | 2300 |
| 10 | 0.40 | 0.40 | 2400 |

According to the results in Tables 1 to 4, in sample nos. 8 to 10 in which the surface-side Tc(116) of the aluminum oxide layer was the same as the substrate-side Tc(116), microscopic chipping readily occurred and the progression of wear was rapid, and the aluminum oxide layer peeled readily due to impact.

On the other hand, in sample nos. 1 to 7 pertaining to the present invention, microscopic chipping of the aluminum oxide layer was suppressed and almost no peeling occurred. In particular, in sample nos. 2 to 7 in which the (104) face and the (116) face constituted the first and second highest peaks in the surface-side peaks of the aluminum oxide layer, it was seen that crater wear was smaller and wear resistance was particularly superior compared to sample nos. 1 and 8 to 10.

REFERENCE SIGNS LIST

1 Cutting tool
2 Rake face
3 Relief face
4 Cutting edge
5 Substrate
6 Coating layer
7 Bottom layer
8 Titanium carbonitride layer
8a MT-titanium carbonitride layer
8b HT-titanium carbonitride layer
9 Intermediate layer
9a Lower intermediate layer
9b Upper intermediate layer
10 Aluminum oxide layer
11 Surface layer

The invention claimed is:

1. A coated tool comprising:
a substrate;
a titanium carbonitride layer laminated on the substrate; and
an aluminum oxide layer having an α-type crystalline structure and laminated on the titanium carbonitride layer;
wherein a surface-side Tc(116) in a surface-side peak is greater than a substrate-side Tc(116) in a substrate-side peak where Tc(116) is an orientation factor expressed by the following general formula Tc(hkl) of the aluminum oxide layer when comparing the substrate-side peak detected by measuring a portion on a substrate side of the aluminum oxide layer and the surface-side peak detected by measuring a portion on a surface side of the aluminum oxide layer in X-ray diffraction analysis of the aluminum oxide layer, orientation factor $Tc(hkl)=\{I(hkl)/I0(hkl)\}/[(1/7)\times\Sigma\{I(HKL)/I0(HKL)\}]$ where (HIM) represents seven faces of (012), (104), (110), (113), (024), (116), and (124);
(hkl) represents any of (012), (104), (110), (113), (024), (116), and (124);
each of I(HKL) and I(hkl) represents a peak intensity of a peak attributed to respective crystal faces detected in X-ray diffraction analysis of the aluminum oxide layer; and
each of I0(HKL) and I0(hkl) represents a standard diffraction intensity of respective crystal faces described in JCPDS card no. 46-1212.

2. The coated tool according to claim 1, wherein I(104) and I(116) in the surface-side peak are either of first and second most intense.

3. The coated tool according to claim 2, wherein the I(116) is 0.5 to 1.7 times as great as the I(104).

4. The coated tool according to claim 1, wherein a surface-side Tc(104) in the surface-side peak is greater than a substrate-side Tc(104) in the substrate-side peak.

5. The coated tool according to claim 1, wherein a range of the substrate-side Tc(116) is no less than 0.3 and no more than 0.7.

6. The coated tool according to claim 1, wherein a range of the surface-side Tc(116) is no less than 0.7 and no more than 2.0.

7. The coated tool according to claim 1, wherein the surface-side Tc(116) in a surface-side peak is measured by performing the X-ray diffraction analysis on a coating layer in a state where a surface layer has been removed by grinding or a state in which the surface layer has not been ground.

8. The coated tool according to claim 1, further comprising:
a surface layer made from TiN and laminated on the aluminum oxide layer.

9. The coated tool according to claim 8, wherein the surface-side peak is measured by X-ray diffraction analysis in a state where the surface layer is removed by grinding.

10. The coated tool according to claim 9, wherein the surface-side peak is measured by X-ray diffraction analysis in a state where the surface layer and not greater than 20% thickness of the aluminum oxide layer are removed by grinding.

11. The coated tool according to claim 8, wherein the surface-side peak is measured by X-ray diffraction analysis in a state where the surface layer is not removed by grinding.

12. The coated tool according to claim 11, wherein the surface-side peak is measured by X-ray diffraction analysis in a state where the surface layer is not removed by grinding as long as the seven peaks of aluminum oxide is measured.

13. The coated tool according to claim 1, wherein the substrate-side peak is measured by X-ray diffraction analysis in a state where the aluminum oxide layer is removed by grinding so that the thickness of the aluminum oxide layer is not less than 10% and not greater than 40% thickness of the aluminum oxide layer before grinding.

14. The coated tool according to claim 1, wherein the substrate-side peak is measured by X-ray diffraction analysis in a state where the thickness of the aluminum oxide layer, removed by grinding, is not less than 60% thickness and not greater than 90% thickness of the aluminum oxide layer before grinding.

15. A coated tool comprising:
a substrate;
a titanium carbonitride layer laminated on the substrate; and
an aluminum oxide layer having an α-type crystalline structure and laminated on the titanium carbonitride layer, the aluminum oxide layer comprising a surface-side portion and a substrate-side portion;
wherein an orientation factor of (116) in the surface-side portion is greater than the orientation factor of (116) in the substrate-side portion, the orientation factor being expressed by a following general formula which is $\{I(hkl)/I0(hkl)\}/[(1/7)\times\Sigma\{I(HKL)/I0(HKL)\}]$,
wherein the (HKL) represents seven crystal faces which are (012), (104), (110), (113), (024), (116), and (124); the (hkl) represents any one of the seven crystal; each of the I(HKL) and the I(hkl) represents an intensity of a peak attributed to respective the (HKL) and the (hkl) detected by X-ray diffraction analysis; and the I0(HKL) and the I0(hkl) represents a standard diffraction intensity of respective the (HKL) and the (hkl) described in JCPDS card no. 46-1212.

16. The coated tool according to claim 15, wherein the surface-side portion is a part having not greater than 20% thickness of the aluminum oxide layer from an outer surface of the aluminum oxide layer.

17. The coated tool according to claim 15, wherein the substrate-side portion has a range between not less than 10% thickness of the aluminum oxide layer thickness and not greater than 40% thickness of the aluminum oxide layer from an inner surface of the aluminum oxide layer facing the titanium carbonitride layer.

18. A coated tool comprising a substrate, a titanium carbonitride layer laminated on the substrate, and an aluminum oxide layer having an α-type crystalline structure and laminated on the titanium carbonitride layer, the coated tool being manufactured by the steps of:
depositing the aluminum oxide layer in a first stage condition, and
depositing the aluminum oxide layer in a second stage condition where a flow rate of an aluminum oxide gas and a catalyst is increased so that a surface-side Tc(116) in a surface-side peak is greater than a substrate-side Tc(116) in a substrate-side peak where Tc(116) is an orientation factor expressed by the following general formula Tc(hkl) of the aluminum oxide layer when comparing the substrate-side peak detected by measuring a portion on a substrate side of the aluminum oxide layer and the surface-side peak detected by measuring a portion on a surface side of the aluminum oxide layer in X-ray diffraction analysis of the aluminum oxide layer, orientation factor $Tc(hkl)=\{I(hkl)/I0(hkl)\}/[(1/7)\times\Sigma\{(HKL)/I0(HKL)\}]$ where (HKL) represents seven faces of (012), (104), (110), (113), (024), (116), and (124);
(hkl) represents any of (012), (104), (110), (113), (024), (116), and (124);
each of I(HKL) and I(hkl) represents a peak intensity of a peak attributed to respective crystal faces detected in X-ray diffraction analysis of the aluminum oxide layer; and
each of I0(HKL) and I0(hkl) represents a standard diffraction intensity of respective crystal faces described in JCPDS card no. 46-1212.

19. The coated tool according to claim 18, wherein the catalyst is H2S.

20. The coated tool according to claim 18, wherein the step of the depositing the aluminum oxide layer in the second stage condition further comprising;
adding a carbon dioxide gas; and keeping the flow rate of the carbon dioxide gas when the aluminum oxide gas and the catalyst constant when the flow rate of the aluminum oxide gas and the catalyst is being increased.

* * * * *